US005767754A

United States Patent [19]

Menna

[11] Patent Number: 5,767,754
[45] Date of Patent: Jun. 16, 1998

[54] BALANCED TO UNBALANCED TRANSMISSION LINE IMPEDANCE TRANSFORMER EXHIBITING LOW INSERTION LOSS

[75] Inventor: Rudy Menna, Harleysville, Pa.

[73] Assignee: General Instrument Corporation, Hatboro, Pa.

[21] Appl. No.: 789,372

[22] Filed: Jan. 24, 1997

[51] Int. Cl.[6] .................................................. H03H 7/42
[52] U.S. Cl. .............................. 333/25; 333/32; 336/170; 336/180
[58] Field of Search ..................... 333/32, 25; 336/170, 336/180, 182, 184

[56] References Cited

U.S. PATENT DOCUMENTS

| | | | |
|---|---|---|---|
| 3,882,432 | 5/1975 | Bowman et al. | 333/32 |
| 4,201,962 | 5/1980 | Hosoya | 333/25 |
| 4,717,896 | 1/1988 | Graham | 333/25 |
| 4,979,233 | 12/1990 | Kawahata | 455/330 |
| 5,319,535 | 6/1994 | Brennen | 363/40 |
| 5,361,409 | 11/1994 | Vice | 455/326 |
| 5,420,551 | 5/1995 | Conte et al. | 333/25 X |
| 5,495,212 | 2/1996 | DeCramer | 333/25 |

*Primary Examiner*—Paul Gensler
*Attorney, Agent, or Firm*—Volpe and Koenig, P.C.

[57] ABSTRACT

A balanced to unbalanced transmission line transformer is disclosed performing impedance transformation with improved frequency response across a wide operational bandwidth. The transmission line transformer significantly improves low frequency output balance by adding an additional transformer winding. The additional winding improves the low frequency response to less than 0.2dB across a given design bandwidth.

20 Claims, 6 Drawing Sheets

BALANCED TO UNBALANCED TRANSMISSION LINE IMPEDANCE TRANSFORMER EXHIBITING LOW INSERTION LOSS

BACKGROUND OF THE INVENTION

1. Field of the Invention

This invention relates generally to broadband impedance matching transformers. More particularly, the invention relates to broadband transmission line transformers which exhibit low insertion loss and provide a matching network between balanced and unbalanced circuits.

2. Description of the Related Art

Transmission lines play an important role in radio frequency communications design. Transmission lines are used to connect various radio frequency circuit elements including connections from radio frequency circuits to antenna systems.

The load coupled to a transmission line should present an impedance equal to the characteristic impedance of the transmission line. The design requirement is to "match" the load to the line.

The importance of a matched load is that a transmission line terminated with a load equal to its characteristic impedance will transfer a signal without reflection. In that instance, all power contained in the signal is transferred from the transmission line to the load. Loads with a resistance unequal to the characteristic transmission line impedance produce reflections.

Another problem that presents itself when using transmission lines is the transition between an unbalanced and a balanced circuit. An unbalanced circuit has one of two signal carrying conductors grounded, such as a coaxial cable. In a balanced circuit, neither of the signal carrying conductors are grounded. Therefore, both conductors have identical impedances to ground. An intervening device is typically required to connect an unbalanced circuit to a balanced circuit.

A balun is a type of transmission line transformer (BALanced-UNbalanced) which allows for the transition between an unbalanced circuit and a balanced circuit and permits impedance matching depending on the turns ratio. The balun provides electrical isolation but passes the transmission line currents. Baluns avoid the high frequency limitations of conventional magnetic transformers since the windings are arranged such that winding capacitance and inductance form a transmission line free of resonances. Baluns can also provide impedance transformations with excellent broadband performance. Most prior art transmission line impedance matching transformers are designed for integer ratios such as 4:1, 9:1 and 16:1. FIG. 1 shows a prior art 1:1 balun converting a balanced circuit to an unbalanced circuit with no impedance transformation. FIG. 2 shows a prior art balanced to unbalanced 4:1 impedance matching transformer. FIG. 3 shows a prior art balanced to unbalanced 4:1 impedance matching transformer on a symmetrical core.

Impedance transformations that produce fractional ratios are more complicated and are typically constructed by interconnecting combinations of integer ratio transformers in series or parallel configurations. As shown in FIG. 4C, a 9:4 impedance matching S transformer is assembled from a 1:1 balun as shown in FIG. 4A and a 4:1 transformer as shown in FIG. 4B. When configured as unbalanced to unbalanced as shown in FIG. 5, or unbalanced to balanced as shown in FIG. 6, these designs result in significant broadband voltage imbalance. This presents problems when designing circuits having uniform or flat frequency response characteristics.

The potential difference or imbalance across the individual transformer connections of the prior art 9:4 impedance matching transformer shown in FIG. 5 is approximately 0.5 to 1.0dB. When connected to a broadband linear amplifier having a push-pull output driver stage, the voltage imbalance reduces the amount of even harmonic cancellation and reduces the overall amplifier gain. A typical push-pull design would have an output transformer with a center tap carrying equal direct currents through each half of the primary winding. Therefore, it is necessary to maintain a high degree of symmetry between the separate halves of the primary winding or the transformer becomes the limiting factor in the circuit.

The voltage imbalances across the individual transformer connections are caused by unequal loading of the transformer outputs, i.e., the path to ground from each balanced individual transformer output is different. Since the low frequency response of each transformer depends on the inductance of each transmission line winding, each output has an unequal amount of isolation from ground. The same problem exists for a 9:4 balanced to unbalanced transformer. Therefore, the prior art approach of achieving a wide operational bandwidth is a constant tradeoff between common mode coil inductance and transmission line length.

While it is possible to construct an impedance matching transmission line transformer using a combination of prior art devices, the result is a technical compromise which achieves undesirable results.

SUMMARY OF THE INVENTION

The balanced to unbalanced broadband transmission line transformer of the present invention improves frequency response across a wide operational bandwidth. The present invention significantly improves low frequency output balance by adding an additional transformer winding. The additional winding improves the low frequency response to less than 0.2dB across a given design bandwidth.

Accordingly, it is an object of the present invention to provide a transmission line transformer which provides balanced to unbalanced circuit transitions and impedance transformation.

Other objects and advantages will become apparent to those skilled in the art after reading the detailed description of a presently preferred embodiment.

DETAILED DESCRIPTION OF THE PREFERRED EMBODIMENT

Figure 1:
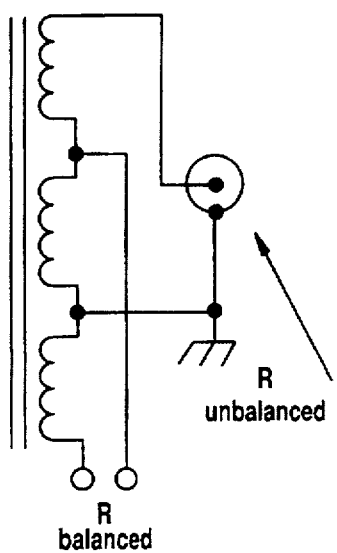
FIG. 1 is an electrical schematic of a prior art transmission line transformer.
Figure 2:
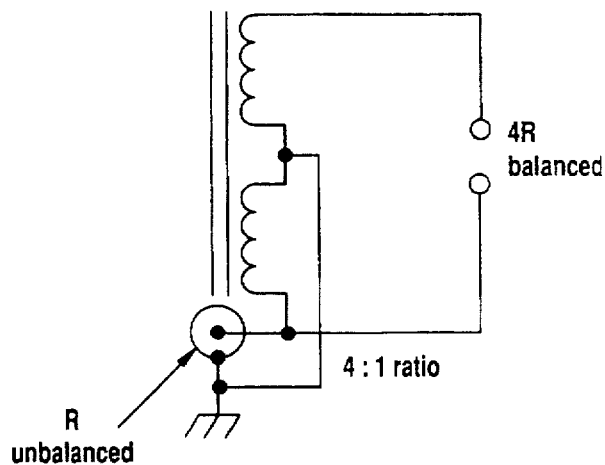
FIG. 2 is an electrical schematic of a prior art impedance matching transmission line transformer.
Figure 3:
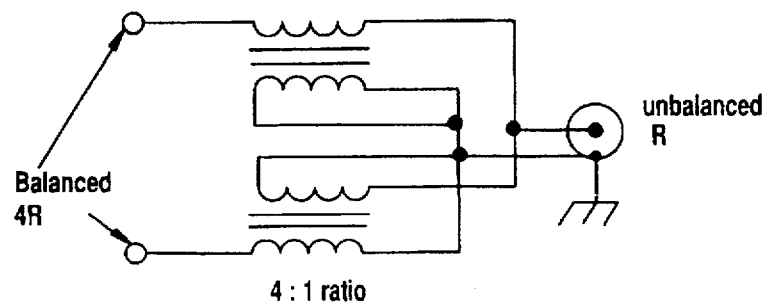
FIG. 3 is an electrical schematic of a prior art impedance matching transmission line transformer.
Figure 4A:
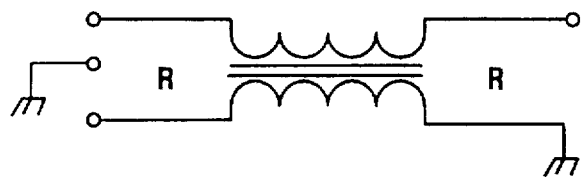
FIG. 4A is an electrical schematic of a prior art 1:1 balun.
Figure 4B:
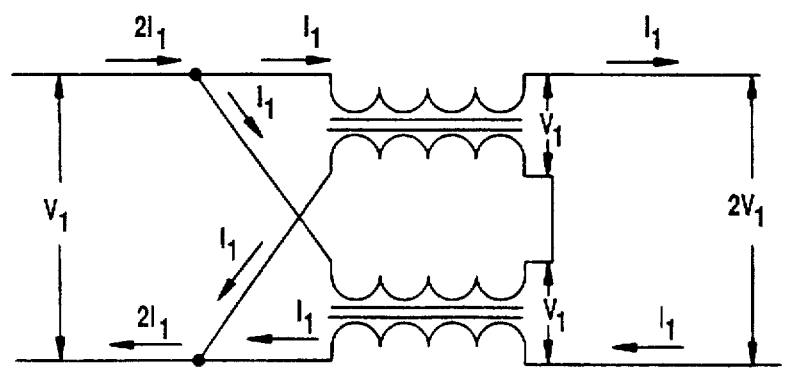
FIG. 4B is an electrical schematic of a prior art 4:1 transformer.
Figure 4C:
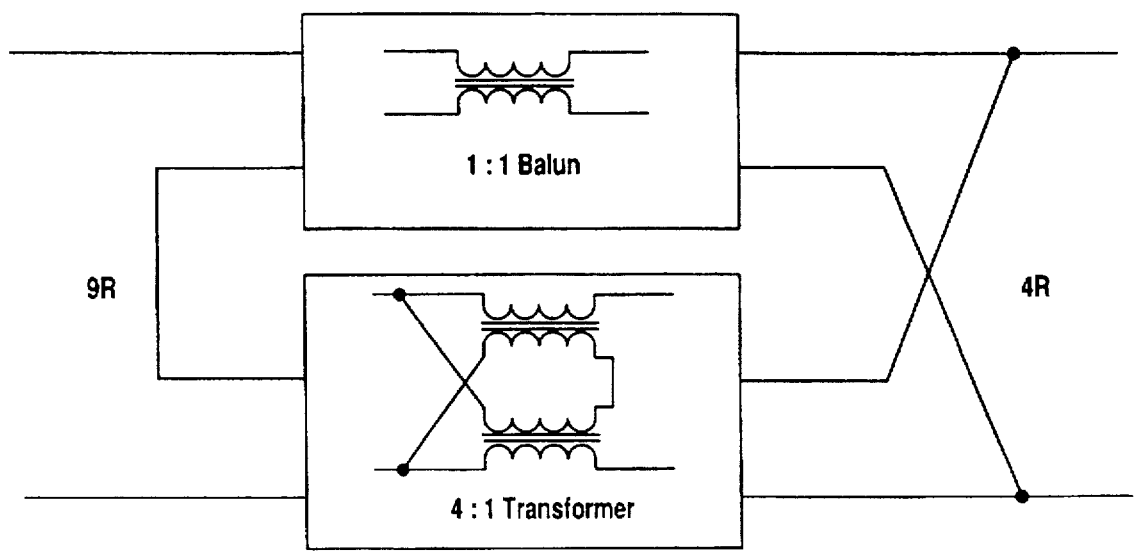
FIG. 4C is an electrical schematic of a prior art 9:4 transformer.
Figure 5:
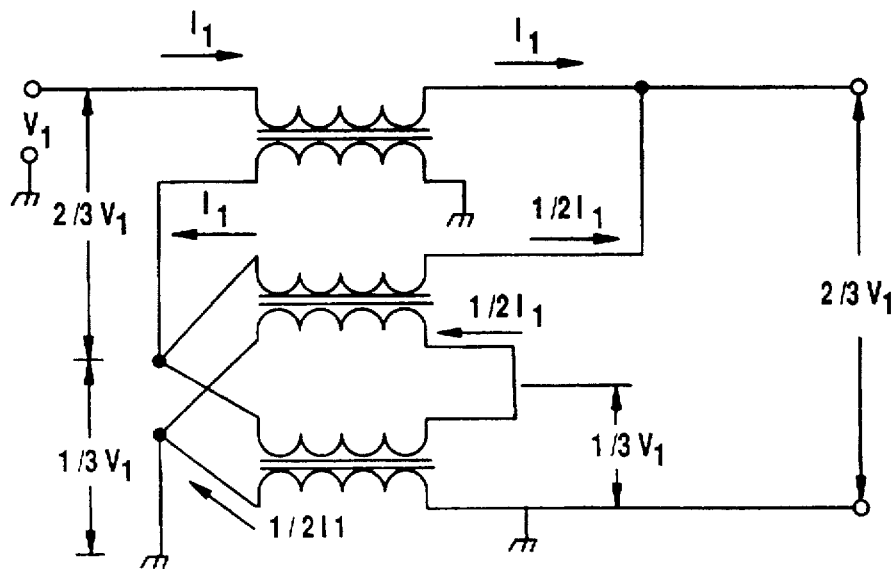
FIG. 5 is an electrical schematic of a prior art 9:4 unbalanced to unbalanced transformer showing the potential differences across the individual transformer windings.

The preferred embodiment will be described with reference to the drawing figures where like numerals represent like elements throughout.

Figure 7:
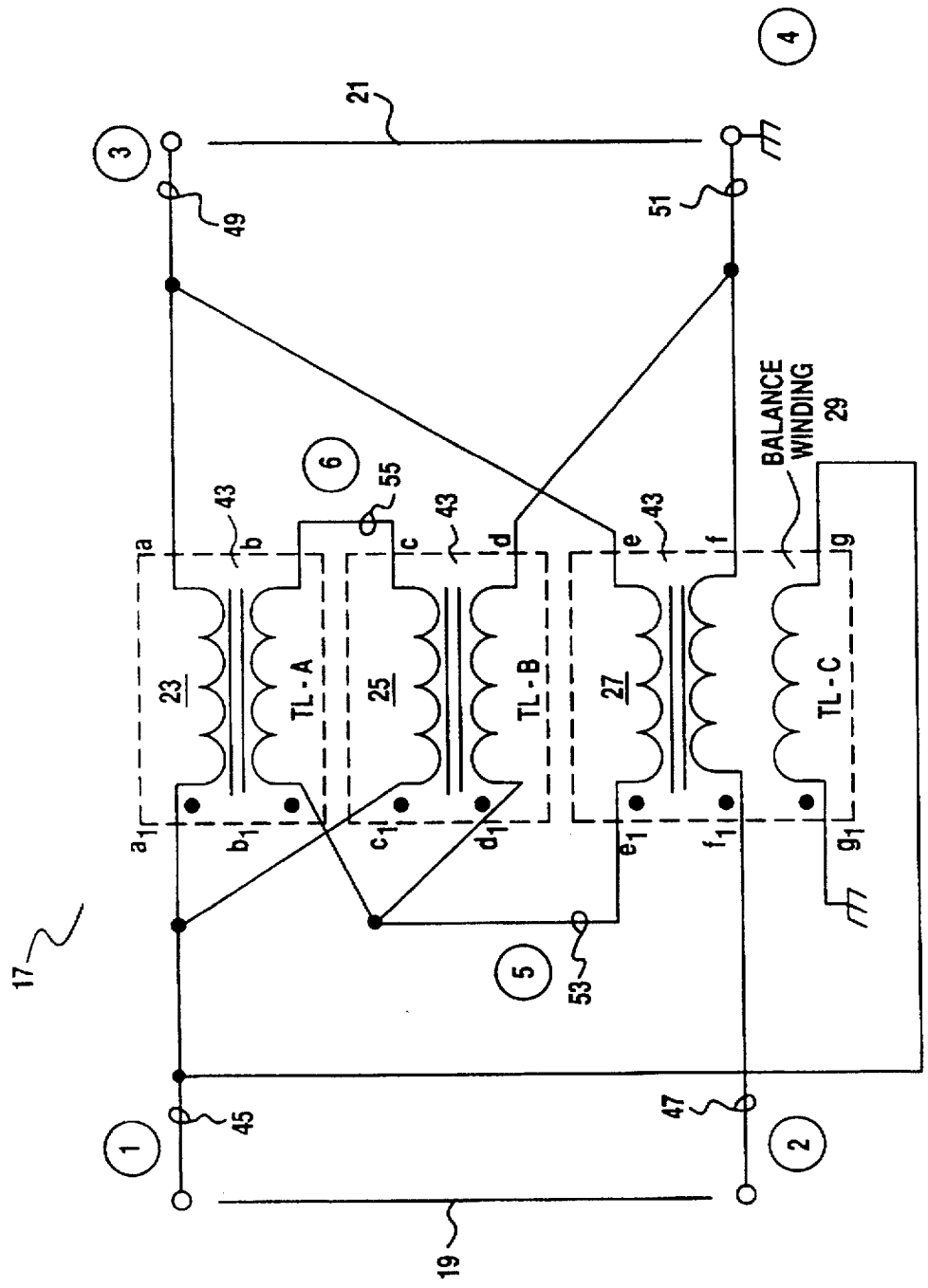
FIG. 7 is an electrical schematic of the preferred embodiment.

Referring to the electrical schematic of FIG. 7, the preferred embodiment of the 9:4 transmission line transformer 17 is shown. The transformer 17 is inserted between a balanced circuit 19 with a characteristic impedance of (9/4) $R_L$ Ohms and an unbalanced circuit 21 with a load impedance of $R_L$ Ohms. The transformer 17 comprises three 1:1 transmission line transformers, TL-A 23, TL-B 25 and TL-C 27 with TL-C 27 having three separate windings. Winding $g_1$-g 29 of transformer TL-C 27 performs the current balancing function. Transformers TL-A 23, TL-B 25 and TL-C 27 can share a symmetrical magnetic coupling 43 or be constructed with individual cores.

The three transformers TL-A 23, TL-B 25 and TL-C 27 are shown in FIG. 7 along with the requisite interconnections as a 9:4 impedance transformation between the balanced 19 and unbalanced 21 circuits. Node 1 45 and node 2 47 are the balanced plus and minus signal conductors. Node 3 49 is the unbalanced signal conductor. Node 4 51 is at ground potential. Node 5 53 and node 6 55 are common winding connections.

Node 1 45 is an external connection for transformer TL-A 23 winding $a_1$, and transformer TL-B 25 winding $c_1$. Node 2 47 is an external connection for transformer TL-C 27 winding $f_1$. Node 3 49 is an external connection for transformer TL-A 23 winding a and transformer TL-C 27 winding e. Node 4 51 is an external connection for transformer TL-B 25 winding d and transformer TL-C winding f. Node 5 53 is a common connection for transformer TL-A 23 winding $b_1$, transformer TL-B 25 winding $d_1$ and transformer TL-C 27 winding $e_1$. Node 6 55 is a common connection for transformer TL-A 23 winding b and transformer TL-B 25 winding c.

The physical construction of each transformer determines the inductance and capacitance of the transformer mutual coupling and also determines the frequency response. This common mode inductance determines the low frequency response of the transformer. Frequencies above the low frequency limit are coupled through the transformer and are unaffected by the common mode inductance. The high frequency limit is determined by each transformer winding length and parasitic capacitance introduced by the common mode inductance and wire interconnections. The inductance of each winding must have high impedance so that the signal does not bypass the transmission line. Typically, the maximum transformer winding length is λ/4 where λ is the wavelength at the highest expected frequency.

The low frequency output response is improved by adding the balance winding $g_1$-g 29 to transformer TL-C 27. The construction of each transformer, TL-A 23, TL-B 25 and TL-C 27 have all windings wound in the same direction so that magnetic field cancellation does not result.

For equal low frequency loading across the transformer 17, the balance winding $g_1$-g 29 must be connected between node 1 45 and node 4 51, ground. From either balanced signal carrying conductor of the balanced circuit 19 exists two separate ground paths from node 1 45 or node 2 47 to ground.

Figure 6:
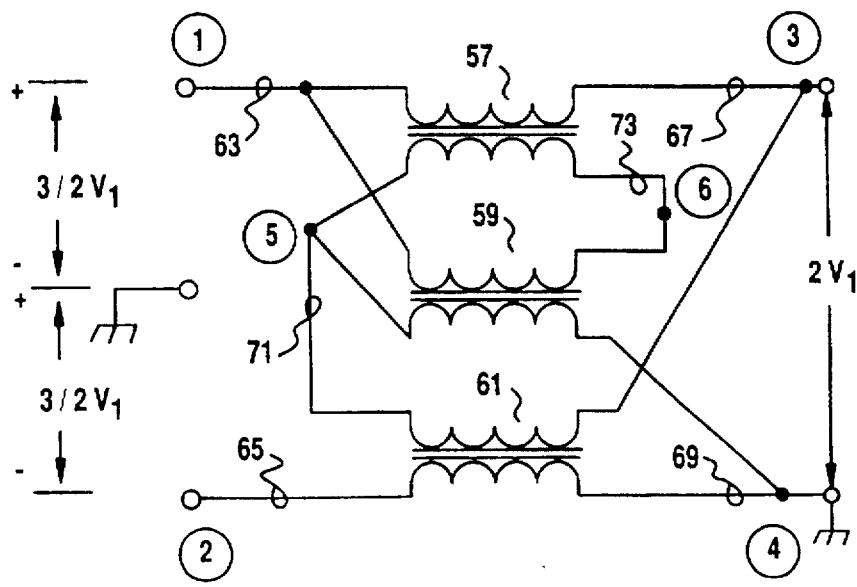
FIG. 6 is an electrical schematic of a prior art 9:4 balanced to unbalanced transformer showing the potential differences across the individual transformer windings.

Referring to FIG. 6, the voltages across each node of the prior art design are as follows:

| Transmission Line | Nodes 1 (63) to 3 (67) | $-0.5 V_1$ |
|---|---|---|
| Transformer A (57) | Nodes 5 (71) to 6 (73) | |
| Transmission Line | Nodes 1 (63) to 6 (73) | $+0.5 V_1$ |
| Transformer B (59) | Nodes 5 (71) to 4 (69) | |
| Transmission Line | Nodes 5 (71) to 3 (67) | $-1.5 V_1$ |
| Transformer C (61) | Nodes 2 (65) to 4 (69) | |

The balance winding 29 of transformer 17 between node 1 45 and node 4 51, ground, results in a potential difference of $1.5V_1$. Adding the balance winding 29 balances the voltage across the load. The balance winding 29 also decreases the transformer 17 imbalance to less than 0.2dB across a given operational bandwidth.

Figure 8:
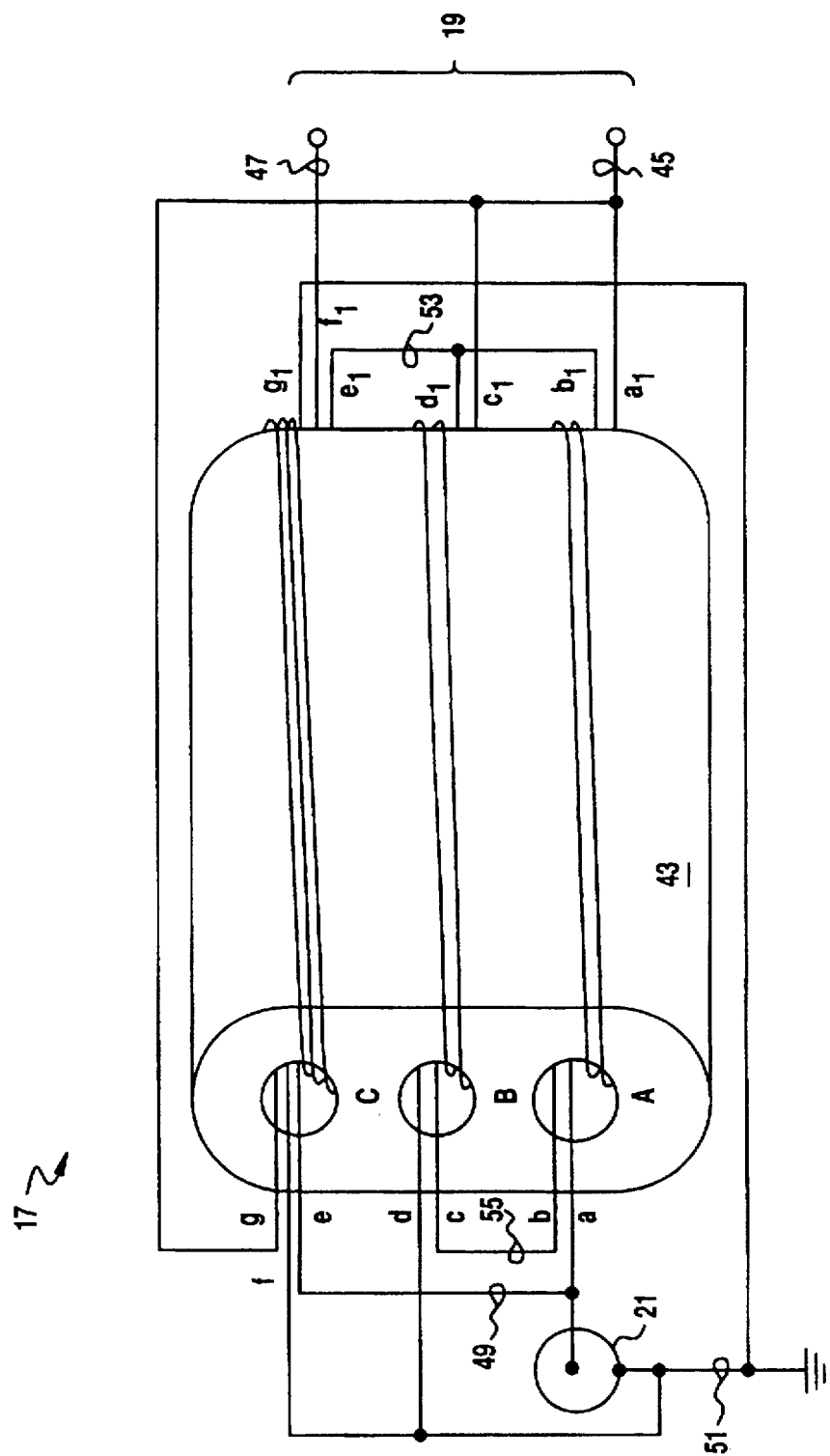
FIG. 8 is a perspective view of the preferred embodiment shown on a symmetrical magnetic core.
Figure 9:
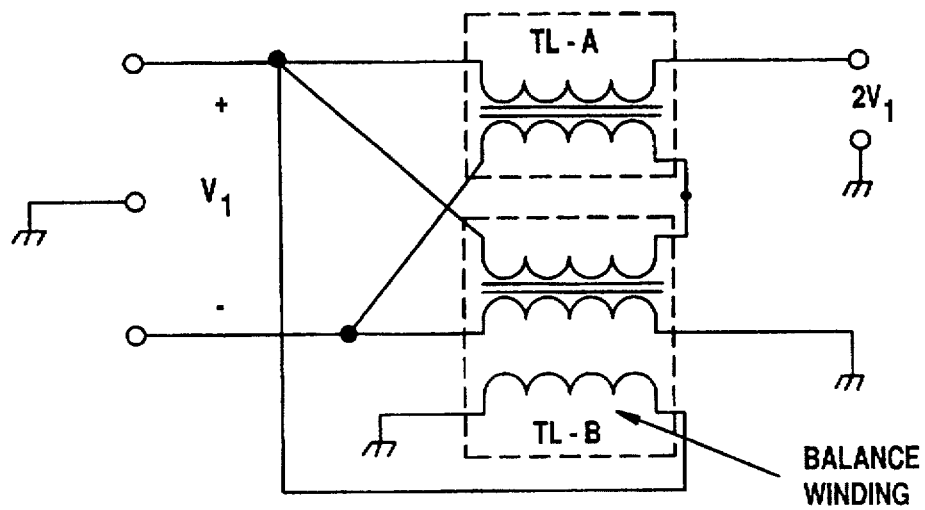
FIG. 9 is an electrical schematic of an alternative embodiment.
Figure 10:
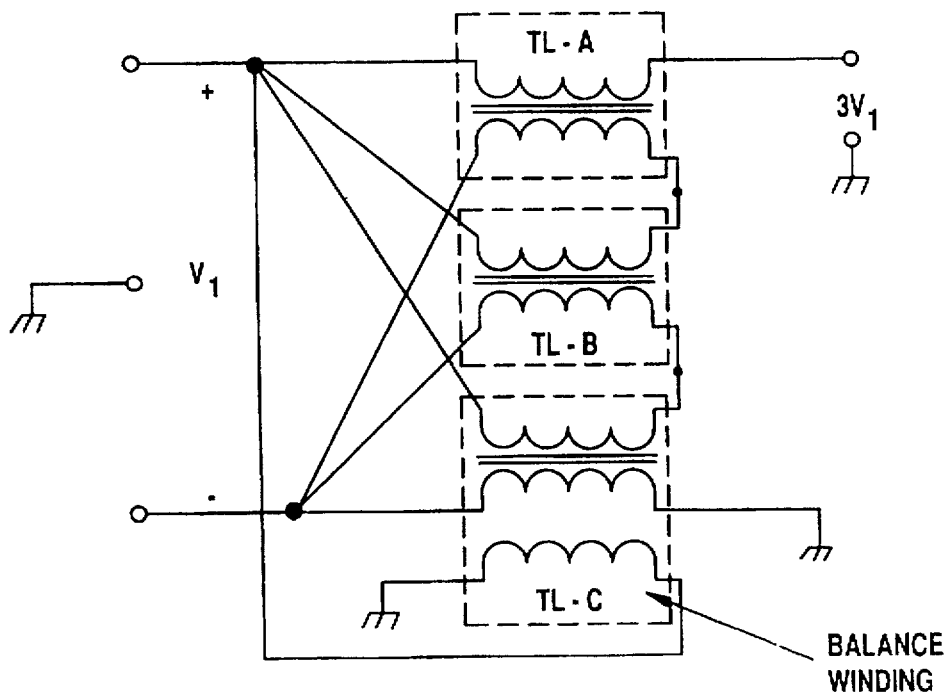
FIG. 10 is an electrical schematic of another alternative embodiment.

Circuit efficiency is improved since voltage and phase balance is not sacrificed when combining balun and transformer functions. The physical realization of the simplicity of the transformer 17 circuit is shown in FIG. 8. Alternative embodiments are shown in FIGS. 9 and 10 for unbalanced to balanced transmission line transformers having impedance matching values of 4:1 and 9:1 respectively. Physical construction of the transformers may include toroids, rods or symmetric cores of powdered iron or ferrite.

Although the invention has been described in part by making detailed reference to certain specific embodiments, such details are intended to be instructive rather than restrictive. It will be appreciated by those skilled in the art that many variations may be made in the structure and mode of operation without departing from the spirit and scope of the invention as disclosed in the teachings herein.

I claim:

1. A broadband impedance matching device for coupling a signal having a predetermined frequency bandwidth between a balanced circuit having two signal carrying conductors and an unbalanced circuit having one signal carrying conductor comprising:

a first node for coupling with a first balanced circuit signal carrying conductor;

a second node for coupling with a second balanced circuit signal carrying conductor;

a third node for coupling with the unbalanced circuit signal carrying conductor;

a fourth node for coupling to a ground;

a first transformer having a magnetic core and a first and a second winding, each winding having a predetermined number of turns and a first and second end;

a second transformer having a magnetic core and a first, a second and a third winding, each winding having a predetermined number of turns and a first and second end;

said first transformer first winding first end coupled to said first node and said first transformer first winding second end coupled to said third node;

said second transformer second winding first end coupled to said second node and said second transformer second winding second end coupled to said fourth node; and said second transformer third winding is a balance winding having its first end coupled to said fourth node and its said second end coupled to said first node.

2. The broadband impedance matching device of claim 1 wherein:

said first transformer second winding first end coupled to said second node and said first transformer second winding second end coupled to an end of a transformer winding which winding has an opposite end coupled to said first node; and said second transformer first winding first end coupled to said first node and said second transformer first winding second end coupled to an end of a transformer winding which winding has an opposite end coupled to said second node.

3. The broadband impedance matching device of claim 2 wherein said end of a transformer winding which winding has an opposite end coupled to said first node is said second transformer first winding and said end of a transformer winding which winding has an opposite end coupled to said second node is said first transformer second winding.

4. The broadband impedance matching device of claim 1 further comprising a third transformer having a magnetic core and a first and a second winding, each winding having a predetermined number of turns and a first and second end.

5. The broadband impedance matching device of claim 4 wherein:

said third transformer first winding first end coupled to said first node and said third transformer first winding second end coupled to an end of a transformer winding which winding has an opposite end coupled to said second node; and said third transformer second winding first end coupled to said second node and said third transformer second winding second end coupled to an end of a transformer winding which winding has an opposite end coupled to said first node.

6. The broadband impedance matching device of claim 5 wherein said end of a transformer winding which winding has an opposite end coupled to said second node is said first transformer second winding and said end of a transformer winding which winding has an opposite end coupled to said first node is said second transformer first winding.

7. The broadband impedance matching device of claim 4 wherein:

said third transformer first winding first end coupled to said first node and said third transformer first winding second end coupled to said first transformer second winding second end;

said third transformer second winding first end coupled to said first transformer second winding first end and said third transformer second winding second end coupled to said fourth node; and said second transformer first winding first end coupled to said first transformer second winding first end.

8. The broadband impedance matching device according to claim 4 wherein said magnetic core of said first, second and third transformers is a ferrite rod.

9. The broadband impedance matching device according to claim 4 wherein said magnetic core of said first, second and third transformers is a ferrite toroid.

10. The broadband impedance matching device according to claim 4 wherein said magnetic core of said first, second and third transformers is common.

11. A broadband impedance matching device for use in a broadband linear amplifier for coupling a signal having a predetermined frequency bandwidth between a balanced circuit having two signal carrying conductors and an unbalanced circuit having one signal carrying conductor comprising:

a first node for coupling with a first balanced circuit signal carrying conductor;

a second node for coupling with a second balanced circuit signal carrying conductor;

a third node, for coupling with the unbalanced circuit signal carrying conductor;

a fourth node for coupling to a ground;

a first transformer having a magnetic core and a first and a second winding, each winding having a predetermined number of turns and a first and second end;

a second transformer having a magnetic core and a first, a second and a third winding, each winding having a predetermined number of turns and a first and second end;

said first transformer first winding first end coupled to said first node and said first transformer first winding second end coupled to said third node;

said second transformer second winding first end coupled to said second node and said second transformer second winding second end coupled to said fourth node; and said second transformer third winding is a balance winding having its first end coupled to said fourth node and its said second end coupled to said first node.

12. The broadband impedance matching device of claim 11 wherein:

said first transformer second winding first end coupled to said second node and said first transformer second winding second end coupled to an end of a transformer winding which winding has an opposite end coupled-to said first node; and said second transformer first winding first end coupled to said first node and said second transformer first winding second end coupled to an end of a transformer winding which winding has an opposite end coupled to said second node.

13. The broadband impedance matching device of claim 12 wherein said end of a transformer winding which winding has an opposite end coupled to said first node is said second transformer first winding and said end of a transformer winding which winding has an opposite end coupled to said second node is said first transformer second winding.

14. The broadband impedance matching device of claim 11 further comprising a third transformer having a magnetic core and a first and a second winding, each winding having a predetermined number of turns and a first and second end.

15. The broadband impedance matching device of claim 14 wherein:

said third transformer first winding first end coupled to said first node and said third transformer first winding second end coupled to an end of a transformer winding which winding has an opposite end coupled to said second node; and said third transformer second winding first end coupled to said second node and said third transformer second winding second end coupled to an end of a transformer winding which winding has an opposite end coupled to said first node.

16. The broadband impedance matching device of claim 15 wherein said end of a transformer winding which winding has an opposite end coupled to said second node is said first transformer second winding and said end of a transformer winding which winding has an opposite end coupled to said first node is said second transformer first winding.

17. The broadband impedance matching device of claim 14 wherein:

said third transformer first winding first end coupled to said first node and said third transformer first winding second end coupled to said first transformer second winding second end;

said third transformer second winding first end coupled to said first transformer second winding first end and said third transformer second winding second end coupled to said fourth node; and said second transformer first winding first end coupled to said first transformer second winding first end.

18. The broadband impedance matching device according to claim 14 wherein said magnetic structure of said first, second and third transformers is a ferrite rod.

19. The broadband impedance matching device according to claim 14 wherein said magnetic structure of said first, second and third transformers is a ferrite toroid.

20. The broadband impedance matching device according to claim 14 wherein said magnetic structure of said first, second and third transformers is common.

* * * * *

UNITED STATES PATENT AND TRADEMARK OFFICE
CERTIFICATE OF CORRECTION

PATENT NO : 5,767,754
DATED : June 16, 1998
INVENTOR(S): Rudy Menna

It is certified that error appears in the above-identified patent and that said Letters Patent is hereby corrected as shown below:

at column 1, line 63, delete "S" between "matching" and "transformer".

In claim 1, at col. 4, line 54, prior to "second" insert --a--.

In claim 1, at col. 4, line 57, prior to "second" insert --a--.

In claim 11, at col. 6, line 5, after "node" delete ",".

In claim 11, at col. 6, line 10, prior to "second" insert --a--.

In claim 11, at col. 6, line 13, prior to "second" insert --a--.

In claim 12, at col. 6, line 31, delete "coupled-to" and insert therefor --coupled to--.

In claim 14, at col. 6, line 47, prior to "second" insert --a--.

Signed and Sealed this

Fourth Day of January, 2000

Attest:

*Attesting Officer*      *Acting Commissioner of Patents and Trademarks*